(12) United States Patent
Choi et al.

(10) Patent No.: US 10,254,320 B2
(45) Date of Patent: Apr. 9, 2019

(54) METHOD FOR MEASURING ELECTRIC POWER VALUE IN AN HVDC SYSTEM

(71) Applicant: LSIS CO., LTD., Anyang-si, Gyeonggi-do (KR)

(72) Inventors: Yongkil Choi, Anyang-si (KR); Hoseok Choi, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 267 days.

(21) Appl. No.: 14/970,234

(22) Filed: Dec. 15, 2015

(65) Prior Publication Data

US 2016/0231366 A1 Aug. 11, 2016

(30) Foreign Application Priority Data

Feb. 11, 2015 (KR) .......................... 10-2015-0021131

(51) Int. Cl.
*G01R 21/133* (2006.01)
*G01R 21/06* (2006.01)

(52) U.S. Cl.
CPC .......... *G01R 21/133* (2013.01); *G01R 21/06* (2013.01)

(58) Field of Classification Search
CPC ... G01R 21/133; G01R 21/1331; G01R 21/06
See application file for complete search history.

(56) References Cited

U.S. PATENT DOCUMENTS

| | | | | |
|---|---|---|---|---|
| 4,263,517 A | * | 4/1981 | Konishi .................... | H02J 3/36 307/151 |
| 8,892,375 B2 | * | 11/2014 | Taft ........................ | G01D 4/002 700/286 |
| 2011/0238360 A1 | * | 9/2011 | Tanaka .................... | G01R 21/01 702/116 |
| 2011/0313590 A1 | | 12/2011 | Kake et al. | |

(Continued)

FOREIGN PATENT DOCUMENTS

| | | |
|---|---|---|
| CN | 1815247 A | 8/2006 |
| CN | 101680922 A | 3/2010 |

(Continued)

OTHER PUBLICATIONS

Japan Patent Office Application No. 2016-005031, Office Action dated Nov. 29, 2016, 2 pages.

(Continued)

*Primary Examiner* — Yasser A Abdelaziez
(74) *Attorney, Agent, or Firm* — K&L Gates LLP

(57) ABSTRACT

A method for measuring electric power value in a HVDC system comprises the steps of receiving current values and voltage values, which are measured from sensor group installed in specific positions of an electric power conversion station; identifying a line impedance of the positions where the sensor group are installed; calculating a first electric power value of the electric power conversion station; calculating a second electric power value of the electric power conversion station; calculating a third electric power value of the electric power conversion station; and determining one of the second and third electric power values as an actual electric power value of the electric power conversion station by comparing the calculated first to third electric power values with one another.

4 Claims, 12 Drawing Sheets

(56) References Cited

U.S. PATENT DOCUMENTS

| | | | | |
|---|---|---|---|---|
| 2013/0128630 A1* | 5/2013 | Jensen | ................. | H02J 3/36 |
| | | | | 363/35 |
| 2013/0229735 A1* | 9/2013 | Rostron | ................ | H02H 3/083 |
| | | | | 361/44 |
| 2013/0258724 A1* | 10/2013 | Shen | ................. | H02J 3/36 |
| | | | | 363/35 |

FOREIGN PATENT DOCUMENTS

| | | |
|---|---|---|
| CN | 202421379 U | 9/2012 |
| CN | 103310124 A | 9/2013 |
| EP | 2528184 | 11/2012 |
| EP | 2597746 | 5/2013 |
| JP | 60238768 | 11/1985 |
| JP | 2000175452 | 6/2000 |
| JP | 2003032895 | 1/2003 |
| JP | 2012161163 | 8/2012 |

OTHER PUBLICATIONS

European Patent Office Application Serial No. 15202521.9 Search Report dated Jul. 6, 2016, 10 pages.

\* cited by examiner

METHOD FOR MEASURING ELECTRIC POWER VALUE IN AN HVDC SYSTEM

CROSS-REFERENCE TO RELATED APPLICATION

Pursuant to 35 U.S.C. § 119(a), this application claims the benefit of earlier filing date and right of priority to Korean Patent Application No. 10-2015-0021131, filed on Feb. 11, 2015, the contents of which is hereby incorporated by reference herein in its entirety.

BACKGROUND OF THE INVENTION

1. Field of the Invention

The present invention relates to a high voltage direct current system (abbreviated as "HVDC" system hereinafter) and more particularly, to a method for calculating an electric power value using values measured through a voltage sensor and an electric current sensor.

2. Description of the Conventional Art

The HVDC system means an electric power transmission system that an electric power transmission station converts an alternating current (AC) electric power generated by an electric power station to a direct current (DC) electric power to transmit the electric power and then an electric power receiving station reconverts the DC electric power to the AC electric power to supply the electric power.

The HVDC system is applied to undersea cable electric power transmission, large capacity long-distance electric power transmission, AC grid interconnection, etc. Also, the HVDC system enables grid interconnection of different frequencies and asynchronism interconnection.

The electric power transmission station converts an AC electric power to a DC electric power. That is, since the status that the AC electric power is transmitted using an undersea cable, etc. is very dangerous, the electric power transmission station converts the AC electric power to the DC electric power and then transmits the electric power to the electric power receiving station.

Meanwhile, various kinds of voltage type converters are used for the HVDC system, and a modular multi-level converter has recently received much attention.

The modular multi-level converter (MMC) is a device that converts an AC electric power to a DC electric power by using a plurality of sub-modules, and is operated by controlling each sub-module in a state of charge, discharge and bypass.

Potential transformers are installed in several sites of the HDVC system in order to control and protect the system.

However, the potential transformer may sense a different measuring value depending on a range of voltage measuring even with the same device and therefore measuring errors might occur, which might be recognized as a system failure, whereby system operation might have to be stopped in a serious condition.

That is, voltage measuring errors of a single potential transformer should have a margin between 0.2% and 0.5%, in general. However, the potential transformer installed in the HDVC system has a very big margin of measuring errors when measuring extra-high voltage, also in the case where a plurality of potential transformers are installed in several sites, the margin of errors caused by a measuring error of each potential transformer will have no option but to get wider.

Also, a more precise sensing device can be used to solve this problem but using a more precise sensing device will bring about installation cost and some technical problems.

SUMMARY OF THE INVENTION

Therefore, an object of the present invention is to provide a method for measuring an electric power value in an HVDC system correcting electric power measuring loss caused by measuring errors of sensors installed in the HDVC system.

Another object of the present invention is to a method for measuring a electric power value in an HVDC system, in which measuring errors of current and voltage are compared with each other using impedance values to calculate an electric power using a measured value with a small error.

To achieve these and other objects and in accordance with the purpose of the present invention, as embodied and broadly described herein, according to the present invention, provided a method for measuring an electric power value in a high voltage direct current system, the method comprising the steps of:

receiving current values and voltage values, which are measured from sensor group installed in specific positions of an electric power conversion station;

identifying a line impedance of the positions where the sensor group are installed;

calculating a first electric power value of the electric power conversion station by using the current value and the voltage value;

calculating a second electric power value of the electric power conversion station by using the current value and the line impedance;

calculating a third electric power value of the electric power conversion station by using the voltage value and the line impedance; and determining any one of the second and third electric power values as an actual electric power value of the electric power conversion station by comparing the calculated the first electric power value, the second electric power value and the third electric power value with one another.

According to one aspect of the invention, the sensor group comprise a current sensor that measures a current of the specific position; and a voltage sensor that measures a voltage of the specific position.

According to another aspect of the invention, the line impedance comprises an impedance of a line connecting the current sensor with the voltage sensor.

According to still another aspect of the invention, the method according to the invention further comprises the step of determining whether an operating condition of the electric power conversion station is an electric power transmission operating condition or an electric power receiving operating condition, wherein the step of identifying a line impedance of the position where the sensor group are installed comprises the step of identifying a line impedance corresponding to the identified operating condition.

According to still another aspect of the invention, the step of determining the actual electric power value comprises the steps of:

comparing the first electric power value, the second electric power value and the third electric power value with one another and identifying a measured value with a smaller measuring error between a measuring error of the voltage value and a measuring error of the current value;

identifying an electric power value calculated using the identified to measured value of the second electric power value and the third electric power value; and determining the electric power value calculated using the identified measured value as the actual electric power value.

According to still another aspect of the invention, the method according to the invention further comprises a step of outputting a signal requesting a change of a sensor that has measured a measured value with a greater measuring error.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
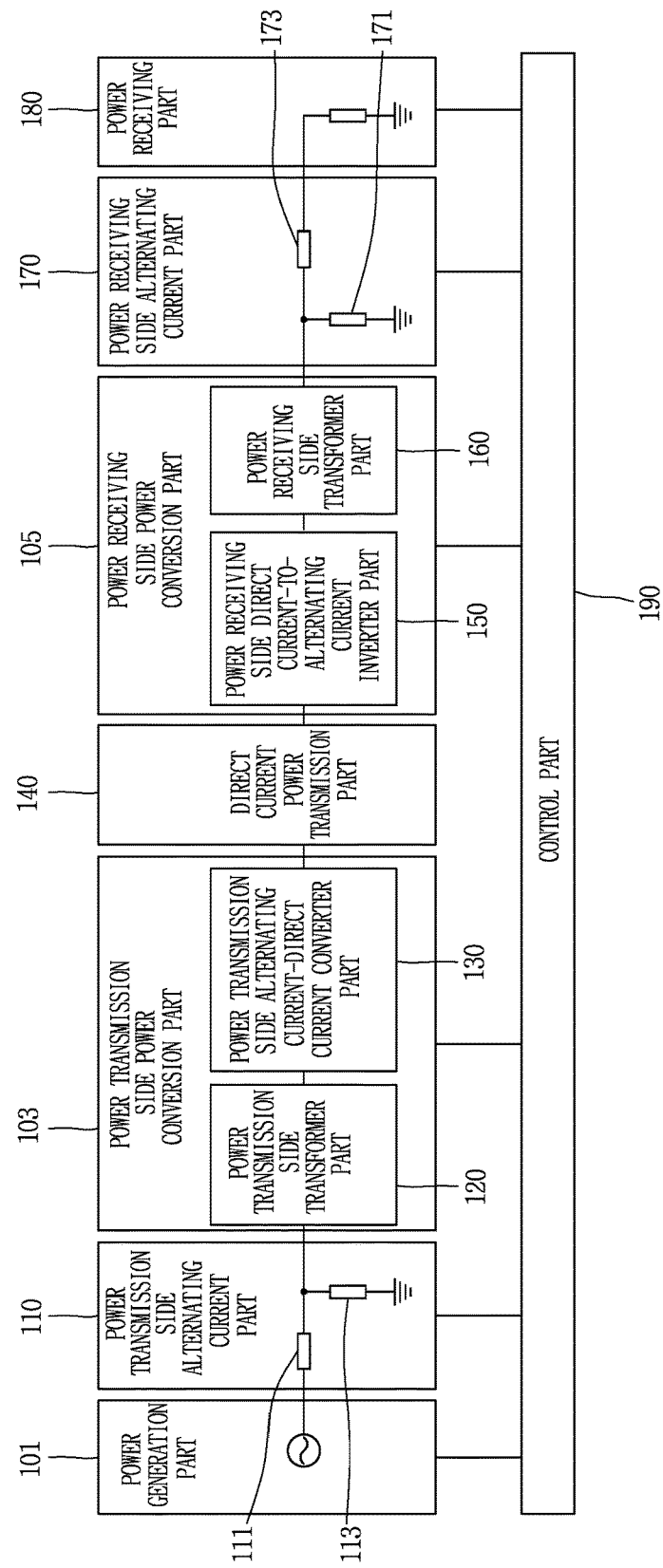
FIG. 1 illustrates a system configuration of an HVDC system according to the present invention of the present invention.

Advantages and features of the present invention, and implementation methods thereof will be clarified through following embodiments described with reference to the accompanying drawings.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Wherever possible, the same reference numbers will be used throughout the drawings to refer to the same or like parts.

In the description of the embodiments of the present invention, when the detailed description of the relevant known function or configuration is determined to unnecessarily obscure the important point of the present invention, the detailed description will be omitted. The terms used hereinafter are defined considering their functions in the embodiments of the present invention, and can be modified depending on intention of a person skilled in the art, practices, or the like. Therefore, the terms used herein should be understood not simply by the actual terms used but by the meaning lying within and the description disclosed herein.

Combinations of each block and each step of a flow chart in the accompanying drawings may be implemented by computer program instructions. Since the computer program instructions may be recorded in a general-purpose computer, a special computer or a processor of other programmable data processing equipment, instructions performed through the computers or the processor of the other programmable data processing equipment generate means for implementing functions described in each block of a drawing or each step of a flow chart. Since the computer program instructions may be stored in a computer usable or computer readable memory that may support the computer or other programmable data processing equipment to implement functions in a specific manner, the instructions stored in the computer usable or computer readable memory may generate product items that include instruction means for performing the functions described in each block of the drawing or each step of the flow chart. Since the computer program instructions may be loaded on the computer or other programmable data processing equipment, a series of operation steps are performed on the computer or the other programmable data processing equipment to generate processes implemented by the computer, whereby the instructions for performing the computer or the other programmable data processing equipment may provide steps for performing the functions described in each block of the drawing or each step of the flow chart.

Also, each block or each step may represent a part of modules, segments or codes, which include one or more executable instructions for executing specified logical function(s). In several replacement embodiments, it should be noted that functions mentioned in the blocks or steps may be generated by departing from the order. For example, two blocks or steps which are shown continually may be performed substantially at the same time, or may be performed in a reverse order depending on their functions.

FIG. 1 illustrates an HVDC system according to one embodiment of the present invention.

As shown in FIG. 1, the HVDC system 100 according to the embodiment of the present invention includes an electric power generation part 101, an electric power transmission side AC part 110, an electric power transmission side electric power conversion part 103, a DC electric power transmission part 140, an electric power receiving side electric power conversion part 105, an electric power receiving side AC part 170, an electric power receiving part 180, and a control part 190. The electric power transmission side electric power conversion part 103 includes an electric power transmission side transformer part 120, and an electric power transmission side AC-to-DC converter part 130.

The electric power receiving side electric power conversion part 105 includes an electric power receiving side DC-to-AC inverter part 150 and an electric power receiving side transformer part 160.

The electric power generation part 101 generates a 3-phases AC electric power.

The electric power generation part 101 may include a plurality of electric power generation stations.

The electric power transmission side AC part 110 delivers the 3-phases AC electric power generated by the electric power generation part 101 to a DC electric power conversion station that includes an electric power transmission side transformer part 120 and an electric power transmission side AC-to-DC converter part 130.

The electric power transmission side transformer part 120 isolates the electric power transmission side AC part 110 from the electric power transmission side AC-to-DC converter part 130 and the DC electric power transmission part 140.

The electric power transmission side AC-to-DC converter part 130 converts a 3-phases AC electric power corresponding to the output of the electric power transmission side transformer part 120 to a DC electric power.

The DC electric power transmission part 140 delivers the DC electric power of the electric power transmission side to the electric power receiving side.

The electric power receiving side DC-to-AC inverter part 150 converts the DC electric power delivered by the DC electric power transmission part 140 to the 3-phases AC electric power.

The electric power receiving side transformer part 160 isolates the electric power receiving side AC part 170 from the electric power receiving side DC-to-AC inverter part 150 and the DC electric power transmission part 140.

The electric power receiving side AC part 170 provides the electric power receiving part 180 with the 3-phases AC electric power corresponding to the output of the electric power receiving side transformer part 160.

The control part 190 controls at least one of the electric power generation part 101, the electric power transmission side AC part 110, the electric power transmission side electric power conversion part 103, the DC electric power transmission part 140, the electric power receiving side electric power conversion part 105, the electric power receiving side AC part 170, the electric power receiving part 180, the electric power transmission station AC-to-DC converter part 130, and the electric power receiving side DC-to-AC inverter part 150.

Particularly, the control part 190 may control turn-on timing and turn-off timing of a plurality of valves within the electric power transmission side AC-to-DC converter part 130 and the electric power receiving side DC-AC inverter part 150. At this time, the valve may comprise a thyristor or an insulated gate bipolar transistor (IGBT).

Figure 2:
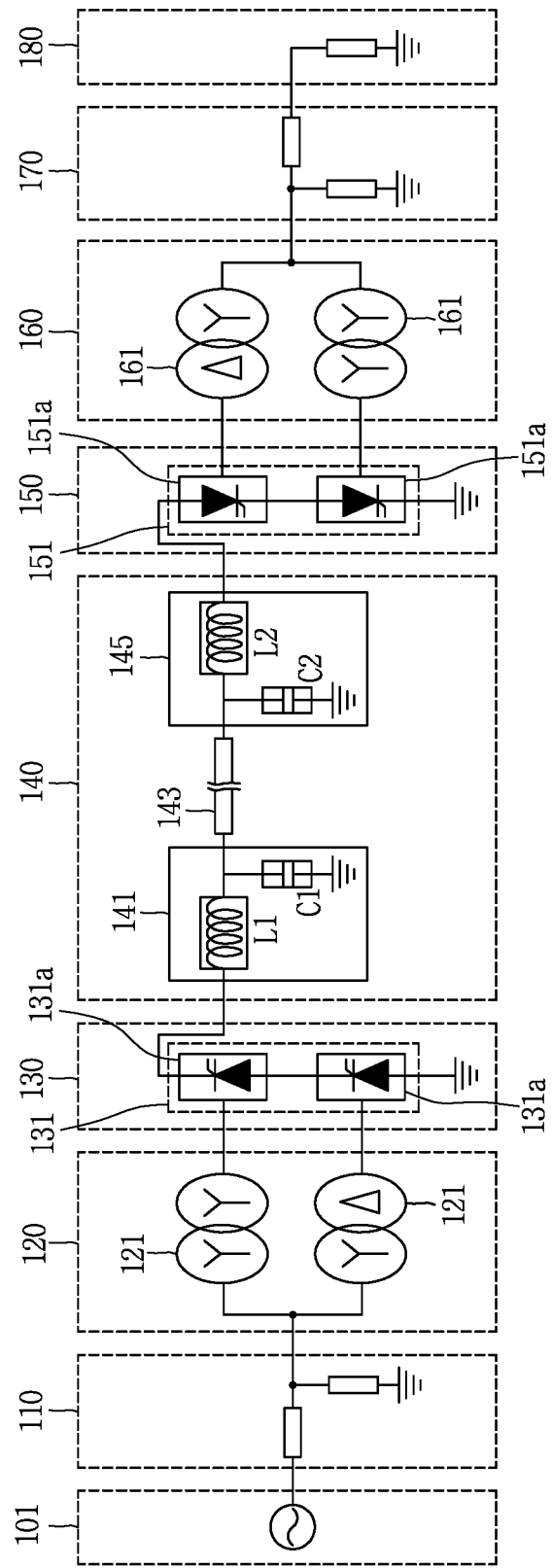
FIG. 2 illustrates a system configuration of a monopolar type HVDC system according to one embodiment of the present invention.

FIG. 2 illustrates a monopolar type HVDC system according to one embodiment of the present invention.

Particularly, FIG. 2 illustrates a system that transmits a DC electric power of a single pole. It is assumed that the single pole is, but not limited to, a positive pole in the following description.

The electric power transmission side AC part 110 includes an AC electric power transmission line 111 and an AC filter 113.

The AC electric power transmission line 111 delivers a 3-phases AC electric power generated by the electric power generation part 101 to the electric power transmission side electric power conversion part 103.

The AC filter 113 removes the other frequency component except for the frequency component that is used by the electric power conversion part 103 from the delivered 3-phases AC electric power.

The electric power transmission side transformer part 120 includes one or more transformers 121 for the positive pole. For the positive pole, the electric power transmission side AC-to-DC converter part 130 includes an AC-to-positive pole DC converter 131 to generate a positive pole DC electric power, and the AC-to-positive pole DC converter 131 includes one or more 3-phases valve bridges 131a that respectively correspond to the transformers 121.

When one 3-phases valve bridge 131a is used, the AC-to-positive pole DC converter 131 can generate a positive pole DC electric power with 6 pulses by using the AC electric power. In this case, a primary coil and a secondary coil of the transformer 121 might have a wiring of a Y-Y shape or Y-delta (Δ) shape.

When two 3-phases valve bridges 131a are used, the AC-to-positive pole DC converter 131 can generate a positive pole DC electric power with 12 pulses by using the AC electric power. In this case, a primary coil ad a secondary coil of one of the transformers 121 might have a wiring of a Y-Y shape, and a primary coil and a secondary coil of the other transformer 121 might have a wiring of a Y-delta (Δ) shape.

When three 3-phases valve bridges 131a are used, the AC-to-positive pole DC converter 131 can generate a positive pole DC electric power with 18 pulses by using the AC electric power. The more pulses the positive pole DC electric power has, the lower the cost for the filter can be.

The DC electric power transmission part 140 includes an electric power transmission side positive pole DC filter 141, a positive pole DC electric power transmission line 143, and an electric power receiving side positive pole DC filter 145.

The electric power transmission side positive pole DC filter 141 includes an inductor L1 and a capacitor C1 and performs DC filtering of a positive pole DC electric power that is outputted by the AC-to-positive pole DC converter 131.

The positive pole DC electric power transmission line 143 has one DC line to transmit the positive pole DC electric power and a ground may be used as a current feedback passage. One or more switches may be arranged on the DC line.

The electric power receiving side positive pole DC filter 145 includes an inductor L2 and a capacitor C2 and performs DC filtering of the positive pole DC electric power that is delivered through the positive pole DC electric power transmission line 143.

The electric power receiving side DC-to-AC inverter part 150 includes a positive pole DC-to-AC inverter 151, and the positive pole DC-to-AC inverter 151 includes one or more 3-phases valve bridges 151a.

The electric power receiving side transformer part 160 includes one or more transformers 161 that respectively correspond to each of the 3-phases valve bridges 151a for the positive pole.

When one 3-phases valve bridge 151a is used, the positive pole DC-to-AC inverter 151 can generate an AC electric power with 6 pulses by using the positive pole DC electric power. In this case, a primary coil ad a secondary coil of the transformer 161 might have a wiring of a Y-Y shape or Y-delta (Δ) shape.

When two 3-phases valve bridges 151*a* are used, the positive pole DC-to-AC inverter 151 can generate an AC electric power with 12 pulses using positive pole DC electric power. In this case, a primary coil ad a secondary coil of one of the transformers 161 might have a wiring of a Y-Y shape, and a primary coil ad a secondary coil of the other transformer 161 might have a wiring of a Y-delta (Δ) shape.

When three 3-phases valve bridges 151*a* are used, the positive pole DC-to-AC inverter 151 can generate an AC electric power with 18 pulses by using the positive pole DC electric power. The more pulses the AC electric power has, the lower price of the filter can be.

The electric power receiving side AC part 170 includes an AC filter 171 and an AC electric power transmission line 173.

The AC filter 171 removes the other frequency component except for the frequency component (for example, 60 Hz) that the electric power receiving part 180 uses, from the AC electric power that is generated by the electric power receiving side electric power conversion part 105.

The AC electric power transmission line 173 delivers the filtered AC electric power to the electric power receiving part 180.

Figure 3:
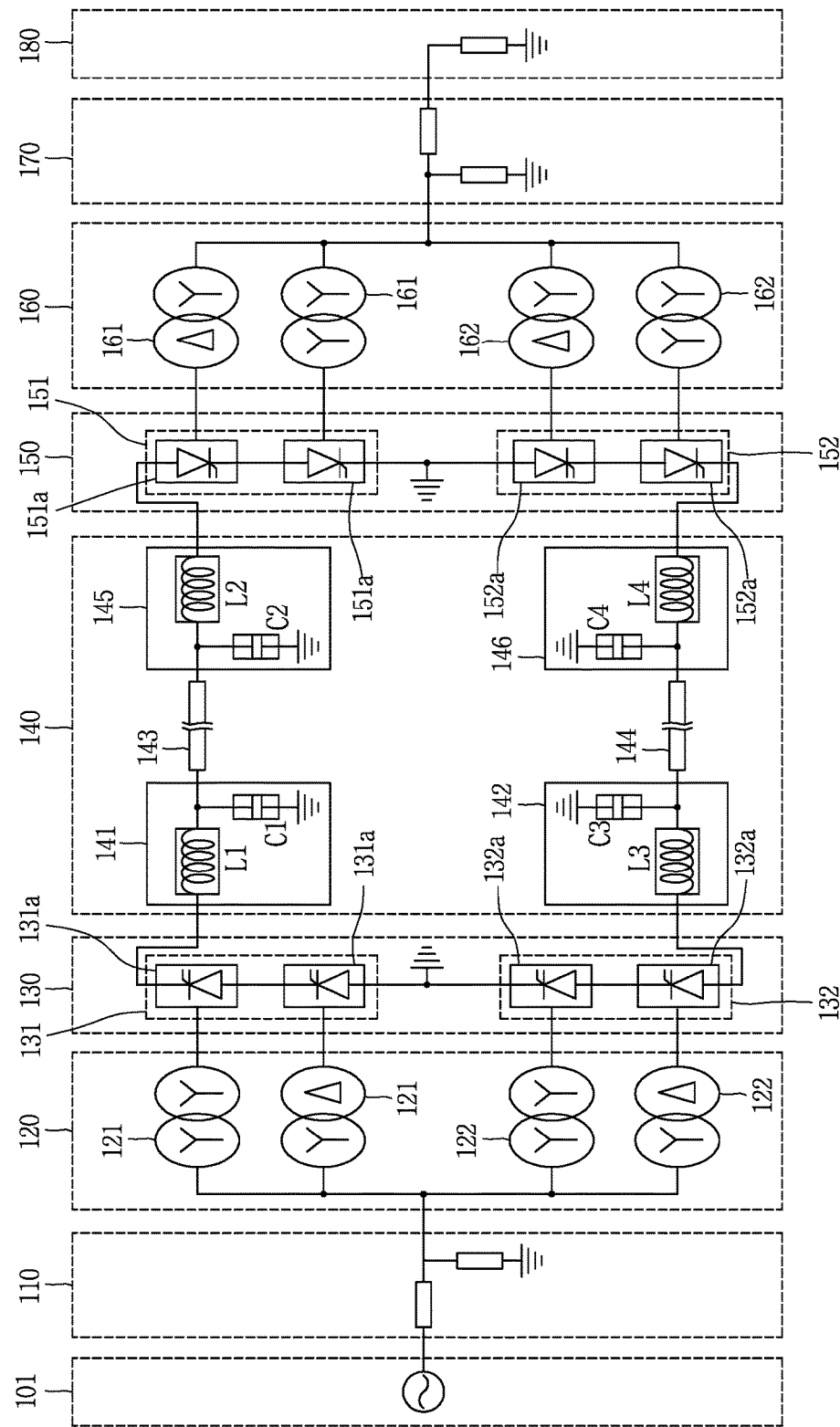
FIG. 3 illustrates a system configuration of a bipolar type HVDC system according to another embodiment of the present invention.

FIG. 3 illustrates a bipolar type HVDC system according to one embodiment of the present invention.

Particularly, FIG. 3 illustrates a system that transmits a DC electric power of two poles. It is assumed that the two poles are, but not limited to, a positive pole and a negative pole in the following description.

The electric power transmission side AC part 110 includes an AC electric power transmission line 111 and an AC filter 113.

The AC electric power transmission line 111 delivers the 3-phases AC electric power generated by the electric power generation part 101 to the electric power transmission side electric power conversion part 103.

The AC filter 113 removes the other frequency component except for the frequency component that is used by the electric power conversion part 103 from the delivered 3-phases AC electric power.

The electric power transmission side transformer part 120 includes one or more transformers 121 for a positive pole and one or more transformers 122 for a negative pole. The electric power transmission side AC-to-DC converter part 130 includes an AC-to-positive pole DC converter 131 to generate a positive pole DC electric power and an AC-to-negative pole DC converter 132 to generate a negative pole DC electric power, and the AC-to-positive pole DC converter 131 includes one or more 3-phases valve bridges 131*a* that respectively correspond to each of one or more transformers 121 for the positive pole, and the AC-to-negative pole DC converter 132 includes one or more 3-phases valve bridges 132*a* that respectively correspond to each of one or more transformers 122 for the negative pole.

When one 3-phases valve bridge 131*a* is used for the positive pole, the AC-to-positive pole DC converter 131 can generate a positive pole DC electric power with 6 pulses by using the AC electric power. In this case, a primary coil ad a secondary coil of the transformer 121 might have a wiring of a Y-Y shape or Y-delta (Δ) shape.

When two 3-phases valve bridges 131*a* are used for the positive pole, the AC-to-positive pole DC converter 131 can generate a positive pole DC electric power with 12 pulses by using the AC electric power. In this case, a primary coil ad a secondary coil of one of the transformers 121 might have a wiring of a Y-Y shape, and a primary coil ad a secondary coil of the other transformer 121 might have a wiring of Y-delta (Δ) shape.

When three 3-phases valve bridges 131*a* are used for the positive pole, the AC-to-positive pole DC converter 131 can generate a positive pole DC electric power with 18 pulses by using the AC electric power. The more pulses the positive pole DC electric power has, the lower the price of the filter can be.

When one 3-phases valve bridge 132*a* is used for the negative pole, the AC-to-positive pole DC converter 132 can generate a positive pole DC electric power with 6 pulses by using the AC electric power. In this case, a primary coil ad a secondary coil of the transformer 122 might have a wiring of a Y-Y shape or Y-delta (Δ) shape.

When two 3-phases valve bridges 132*a* are used for the negative pole, the AC-to-positive pole DC converter 132 can generate a positive pole DC electric power with 12 pulses by using the AC electric power. In this case, a primary coil ad a secondary coil of one of the transformers 122 might have a wiring of a Y-Y shape, and a primary coil ad a secondary coil of the other transformer 122 might have a wiring of a Y-delta (Δ) shape.

When three 3-phases valve bridges 132*a* are used for the negative pole, the AC-to-positive pole DC converter 132 can generate a positive pole DC electric power with 18 pulses by using the AC electric power. The more pulses the negative pole DC electric power has, the lower the price of the filter can be.

The DC electric power transmission part 140 comprises an electric power transmission side positive pole DC filter 141, an electric power transmission side negative pole DC filter 142, a positive pole DC electric power transmission line 143, a negative pole DC electric power transmission line 144, an electric power receiving side positive pole DC filter 145, and an electric power receiving side negative pole DC filter 146.

The electric power transmission side positive pole DC filter 141 includes an inductor L1 and a capacitor C1 and performs DC filtering of the positive pole DC electric power that is outputted by the AC-to-positive pole DC converter 131.

The electric power transmission side negative pole DC filter 142 includes an inductor L3 and a capacitor C3 and performs DC filtering of the negative pole DC electric power that is outputted by the AC-to-negative pole DC converter 132.

The positive pole DC electric power transmission line 143 has one DC line to transmit the positive pole DC electric power, and a ground may be used as a current feedback passage. One or more switches can be installed on the DC line.

The negative pole DC electric power transmission line 144 has one DC line to transmit the negative pole DC electric power, and a ground may be used as a current feedback passage. One or more switches can be arranged on the DC line.

The electric power receiving side positive pole DC filter 145 includes an inductor L2 and a capacitor C2 and performs DC filtering of the positive pole DC electric power that is delivered through the positive pole DC electric power transmission line 143.

The electric power receiving side negative pole DC filter 146 includes an inductor L4 and a capacitor C4 and performs DC filtering of the negative pole DC electric power that is transmitted through the negative pole DC electric power transmission line 144.

The electric power receiving side DC-to-AC inverter part 150 includes a positive pole DC-to-AC inverter 151 and a negative pole DC-to-AC inverter 152, the positive pole DC-to-AC inverter 151 includes one or more 3-phases valve bridges 151*a*, and the negative pole DC-to-AC inverter 152 includes one or more 3-phases valve bridges 152*a*.

The electric power receiving side transformer part 160 includes one or more transformers 161 for the positive pole, which respectively corresponds to each of one or more 3-phases valve bridges 151*a*, and includes one or more transformers 162 for the negative pole, which respectively corresponds to each of one or more 3-phases valve bridges 152*a*.

When one 3-phases valve bridge 151*a* is used for the positive pole, the positive pole DC-AC converter 151 can generate an AC electric power with 6 pulses by using the positive pole DC electric power. In this case, a primary coil ad a secondary coil of the transformer 161 might have a wiring of a Y-Y shape or Y-delta (Δ) shape.

When two 3-phases valve bridges 151*a* are used for the positive pole, the positive pole DC-AC converter 151 can generate an AC electric power with 12 pulses by using the positive pole DC electric power. In this case, a primary coil ad a secondary coil of one of the transformers 161 might have a wiring of a Y-Y shape, and a primary coil ad a secondary coil of the other transformer 161 might have a wiring of a Y-delta (Δ) shape.

When three 3-phases valve bridges 151*a* are used for the positive pole, the positive pole DC-AC converter 151 can generate an AC electric power with 18 pulses by using the positive pole DC electric power. The more pulses the AC electric power has, the lower the price of the filter can be.

When one 3-phases valve bridge 152*a* is used for the negative pole, the negative pole DC-AC converter 152 can generate an AC electric power with 6 pulses by using the negative pole DC electric power. In this case, a primary coil ad a secondary coil of the transformer 162 might have a wiring of a Y-Y shape or Y-delta (Δ) shape.

When two 3-phases valve bridges 152*a* are used for the negative pole, the negative pole DC-AC converter 152 can generate an AC electric power with 12 pulses by using the negative pole DC electric power. In this case, a primary coil ad a secondary coil of one of the transformers 162 might have a wiring of a Y-Y shape, and a primary coil ad a secondary coil of the other transformer 162 might have a wiring of a Y-delta (Δ) shape.

When three 3-phases valve bridges 152*a* are used for the negative pole, the negative pole DC-AC converter 152 can generate an AC electric power with 18 pulses by using the negative pole DC electric power. The more pulses the AC electric power has, the lower the price of the filter can be.

The electric power receiving side AC part 170 includes an AC filter 171 and an AC electric power transmission line 173.

The AC filter 171 removes a residual frequency component except for the frequency component (for example, 60 Hz) that the electric power receiving part 180 uses, from the AC electric power that is generated by the electric power receiving side electric power conversion part 105.

The AC electric power transmission line 173 delivers the filtered AC electric power to the electric power receiving part 180.

Figure 4:
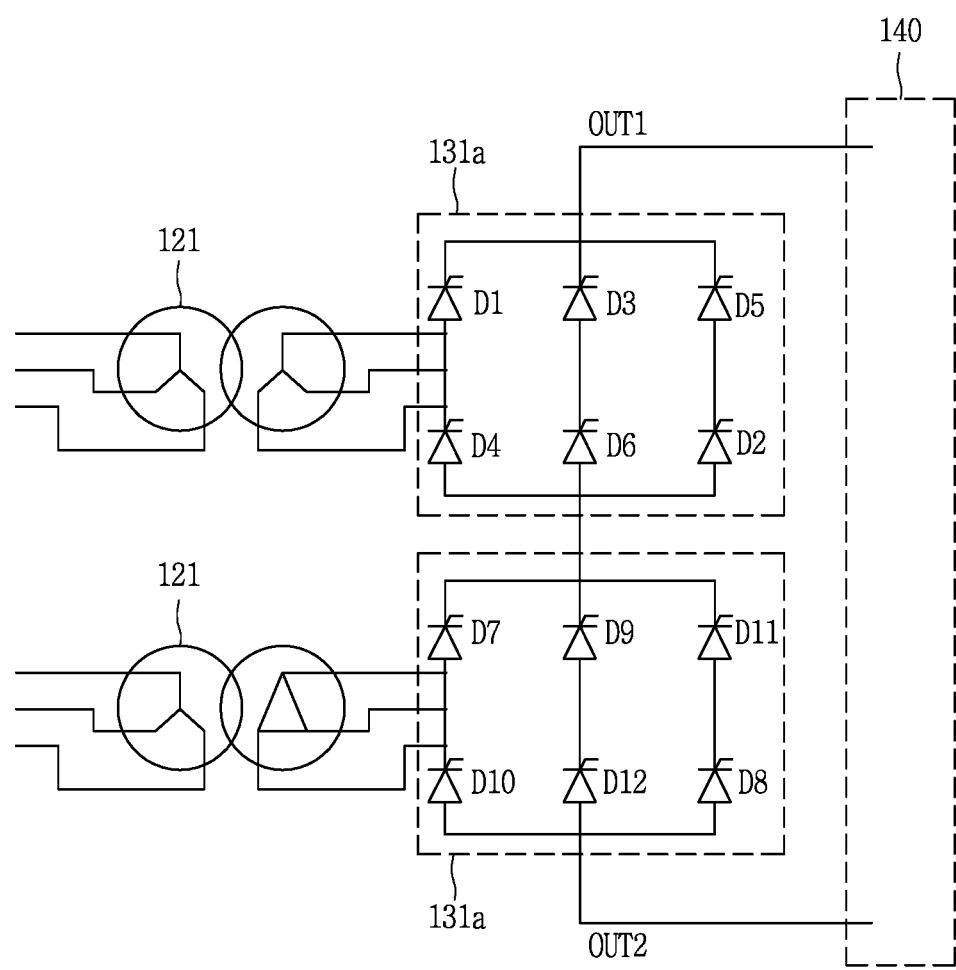
FIG. 4 illustrates a wiring of a transformer and a 3-phases valve bridge according to one embodiment of the present invention.

FIG. 4 illustrates a wiring of a transformer and a 3-phases valve bridge according to one embodiment of the present invention.

Particularly, FIG. 4 illustrates a wiring of two transformers 121 for the positive pole and two 3-phases valve bridges 131*a* for the positive pole. Since a wiring of two transformers 122 for the negative pole and two 3-phases valve bridges 132*a* for the negative pole, a wiring of two transformers 161 for the positive pole and two 3-phases valve bridges 151*a* for the positive pole, a wiring of two transformers 162 for the negative pole and two 3-phases valve bridges 152*a* for the negative pole, a wiring of one transformer 121 for the positive pole and one 3-phases valve bridge 131*a* for the positive pole, a wiring of one transformer 161 for the positive pole and one 3-phases valve bridge 151*a* for the positive pole, etc. can easily be derived from the embodiment of the present invention as shown in FIG. 4, those figures and descriptions will be omitted.

In FIG. 4, the transformer 121 that has a wiring of a Y-Y shape is denoted as the upper side transformer, the transformer 121 that has a wiring a Y-delta shape as the lower side transformer, the 3-phases valve bridge 131*a* connected to the upper side transformer as the upper 3-phases valve bridge, and the 3-phases valve bridge 131*a* connected to the lower side transformer as the lower 3-phases valve bridge.

The upper 3-phases valve bridge and the lower 3-phases valve bridge have two output terminals, the first output terminal OUT1 and the second output terminal OUT2, that output a DC electric power.

The upper 3-phases valve bridge includes six valves D1 to D6, and the lower 3-phases valve bridge includes six valves D7 to D12.

The valve D1 has a cathode connected to the first output terminal OUT1 and an anode connected to a first terminal of a secondary coil of the upper transformer.

The valve D2 has a cathode connected to an anode of the valve D5 and an anode connected to an anode of the valve D6.

The valve D3 has a cathode connected to the first output terminal OUT1 and an anode connected to a second terminal of the secondary coil of the upper transformer.

The valve D4 has a cathode connected to the anode of the valve D1 and an anode connected to the anode of the valve D6.

The valve D5 has a cathode connected to the first output terminal OUT1 and an anode connected to a third terminal of the secondary coil of the upper transformer.

The valve D6 has a cathode connected to the anode of the valve D3.

The valve D7 has a cathode connected to the anode of the valve D6 and an anode connected to a first terminal of a secondary coil of the lower transformer.

The valve D8 has a cathode connected to an anode of the valve D11 and an anode connected to the second output terminal OUT2.

The valve D9 has a cathode connected to the anode of the valve D6 and an anode connected to a second terminal of the secondary coil of the lower transformer.

The valve D10 has a cathode connected to the anode of the valve D7 and an anode connected to the second output terminal OUT2.

The valve D11 has a cathode connected to the anode of the valve D6 and an anode connected to a third terminal of the secondary coil of the lower transformer.

The valve D12 has a cathode connected to the anode of the valve D9 and an anode connected to the second output terminal OUT2.

Meanwhile, the electric power receiving side DC-to-AC inverter part 150 can be configured with a modular multi-level converter 200.

The modular multi-level converter 200 can transform a DC electric power into an AC electric power by using a plurality of sub-modules 210.

A configuration of the modular multi-level converter 200 will be described with reference to FIGS. 5 and 6.

Figure 5:
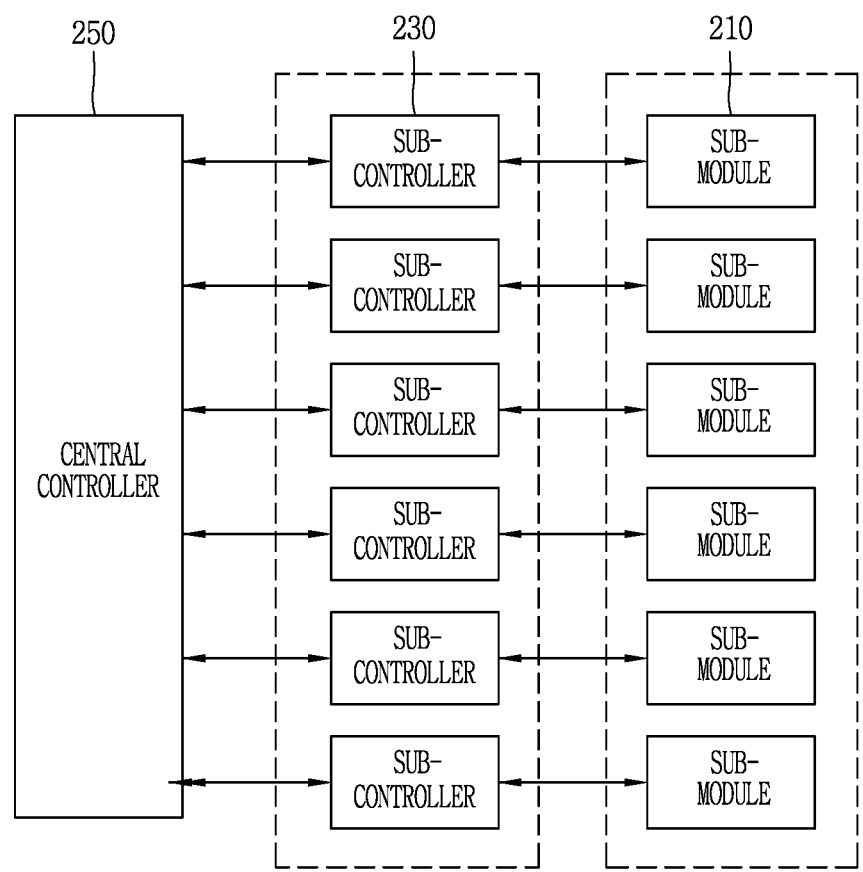
FIG. 5 is a block diagram illustrating a modular multi-level converter according to one embodiment of the present invention.
Figure 6:
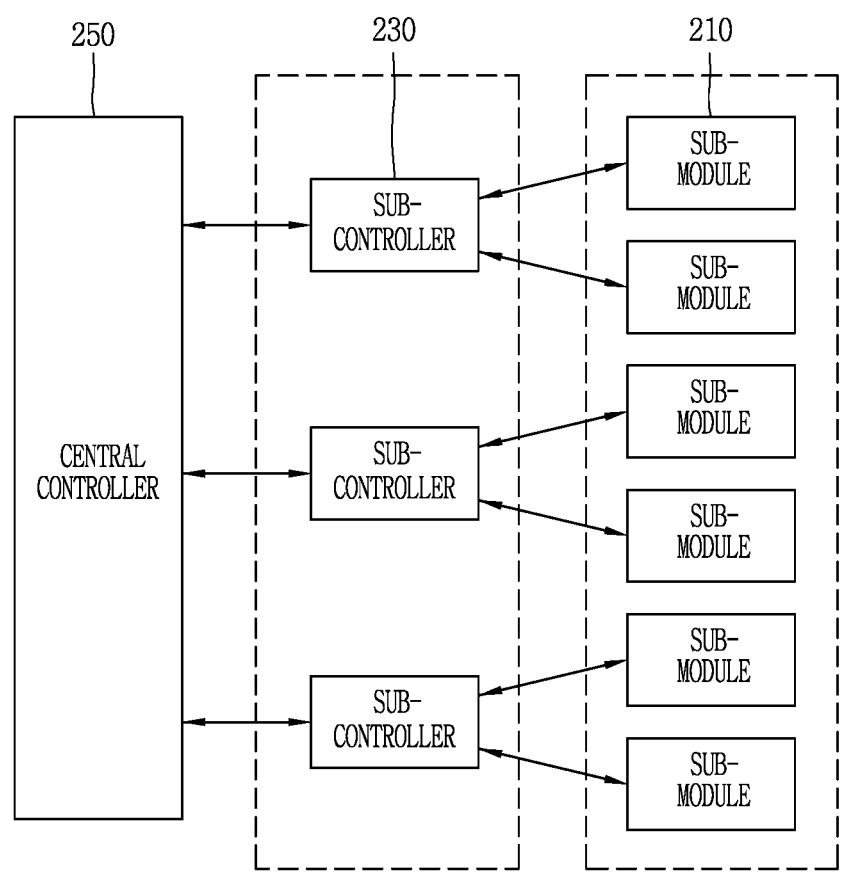
FIG. 6 is a block diagram illustrating a modular multi-level converter according to another embodiment of the present invention.

FIGS. 5 and 6 are schematic block diagrams of the modular multi-level converter 200.

The modular multi-level converter 200 comprises a central controller 250, a plurality of sub-controllers 230, and a plurality of sub-modules 210.

The central controller 250 controls the plurality of sub-controller 230, each of which controls a corresponding sub-module that is connected to itself.

At that time, as shown in FIG. 5, one sub-controller 230 is connected to one sub-module 210 and therefore can control a switching operation of the sub-module 210 that is connected to itself, based on a control signal that is transmitted through the central controller 250.

Also, on the other hand, one sub-controller 230 is connected to the plurality of sub-modules 210 as shown in FIG. 6 to identify each control signal of the plurality of sub-modules 210 that are connected thereto, by using a plurality of control signals that are transmitted from the central controller 250, and therefore control the plurality of sub-modules 210, respectively, based on the identified control signals.

The central controller 250 determines an operation condition of the plurality of sub-modules 210 and generates control signals to control operations of the plurality of sub-modules 210 in accordance with the determined operation condition.

And, when the control signal is generated, the central controller 250 sends the generated control signal to the sub-controller 230.

At this time, an address is assigned to the plurality of sub-controllers 230, whereby the central controller 250 generates a control signal for each sub-module 210 and transmits the generated control signal to the sub-controller 230 on the basis of the assigned address.

For example, the first sub-module 210 and the first sub-controller 230 are connected to each other, whereby switching control of the first sub-module 210 is performed through the first sub-controller 230, and if address information assigned to the first sub-module 210 is '1', the central controller 250 transmits the control signal corresponding to the first sub-module 210 to which the address of '1' is assigned.

And, the first sub-controller 230 receives the control signal transmitted from the central controller 250 and controls the sub-module 210 connected thereto in accordance with the received control signal.

At this time, the control signal transmitted from the central controller 250 to the sub-controller 230 can comprise switching condition information of the sub-module 210 and identification information indicating which sub-module 210 applies the switching condition information.

Therefore, using the identification information included in the control signal, the sub-controller 230 identifies whether the control signal transmitted from the central controller 250 is the control signal corresponding to the sub-module connected thereto and therefore can control a switching of the sub-module based on the switching condition information included in the control signal.

At this time, if the identification information included in the received control signal does not correspond to the sub-module 210 connected to the sub-controller 230, the sub-controller 230 does not apply the switching operation condition based on the received control signal to the sub-module 210.

And, the sub-controller 230 transfers the received control signal to another sub-controller that controls the sub-module corresponding to the identification information included in the control signal.

Hereinafter, the sub-module 210, the sub-controller 230, and the central controller 250 will be described in more detail.

The sub-module 210 receives an input of a DC electric power and can perform any one of charging, discharging, and bypass operations.

The sub-module 210 includes a switching device including a diode and therefore, as switching operation and rectification operation of the diode, it can perform any one of charge, discharge, and bypass operations.

Each of the sub-controllers 230 obtains information on the sub-module 210 and inserts the obtained information into the address information. And, each of the sub-controllers 230 transmits the address information, to which the obtained information is inserted, to the central controller 250 in response to a request of the central controller 250.

To this end, each of the sub-controllers 230 can have at least one sensor. The sensor included in the sub-controller 230 can measure at least one of an electric current and a voltage of the sub-module 210.

The sub-controller 230 can insert at least one information of the measured electric current and voltage information of the sub-module 210 into the address information. At this time, the measured information can be a voltage information charged in the sub-module 210.

Also, the sub-controller 230 can insert reference information transmitted from the central controller 250 into the address information. The reference information can include a reference DC voltage and a switching carrier signal.

Also, the sub-controller 230 can store switching history information of the sub-module 210 in the address information. The switching history information means the history information on charging operation, discharging operation, and bypass operation that are performed by the sub-module 210.

In other words, the sub-controller 230 identifies current switching information on the sub-module 210 and switching information performed previously and inserts the identified switching information into the address information.

Also, an address is assigned to each of the sub-controllers 230 and therefore the address information can include identification information corresponding to the assigned address.

And, when the central controller 250 receives a signal requesting identification of its own address, the sub-controller 230 transmits the address information to the central controller 250 in response to the received request signal.

At this time, the transmitted address information includes not only the identification information described as above but also various kinds of information related to the sub-module 210.

The central controller 250, just with identification of the address, can even identify status information of the sub-module 210 controlled by the sub-controller 230.

Also, the central controller 250 may control a switching status of the plurality of sub-modules 210 on the basis of the identified status information.

For example, a plurality of sub-modules 210 are provided, and therefore a sub-module can only perform a continuing charge operation, and the other sub-modules can only perform a discharge operation or bypass operation. Therefore, the central controller 250, using the switching history information included in the identified address information, determines sub-modules performing discharge operations, sub-modules performing charge operations, and sub-modules performing bypass operations at the current time, respectively.

Also, the central controller 250, using charge voltage information included in the address information, can determine the number of sub-modules that should perform discharge operations based on the electric power needed at the current time.

In other words, the central controller 250 can control overall operations of the modular multi-level converter 200.

The central controller 250 can measure the electric current and voltage of the AC parts 110 and 170 connected thereto and the DC electric power transmission part 140.

Also, the central controller 250 can calculate a total control value. In this case, the total control value can be a target value of a voltage, a current and a frequency size of an output AC electric power of the modular multi-level converter 200.

The central controller 250 can calculate the total control value based on one or more of the current and voltage of the AC parts 110 and 170 connected to the modular multi-level converter 200 and the current and voltage of the DC electric power transmission part 140.

Meanwhile, the central controller 250 can control the operation of the modular multi-level converter 200 based on one or more of a base active electric power, a base reactive electric power, a reference current, and a reference voltage, which are received from a supervisory controller (not shown) through a communication device (not shown).

The central controller 250 can transmit and receive data to and from the sub-controller 230 and therefore can receive the address information described as above.

Connection of the plurality of sub-modules 210 included in the modular multi-level converter 200 will be described with reference to FIG. 7.

Figure 7:
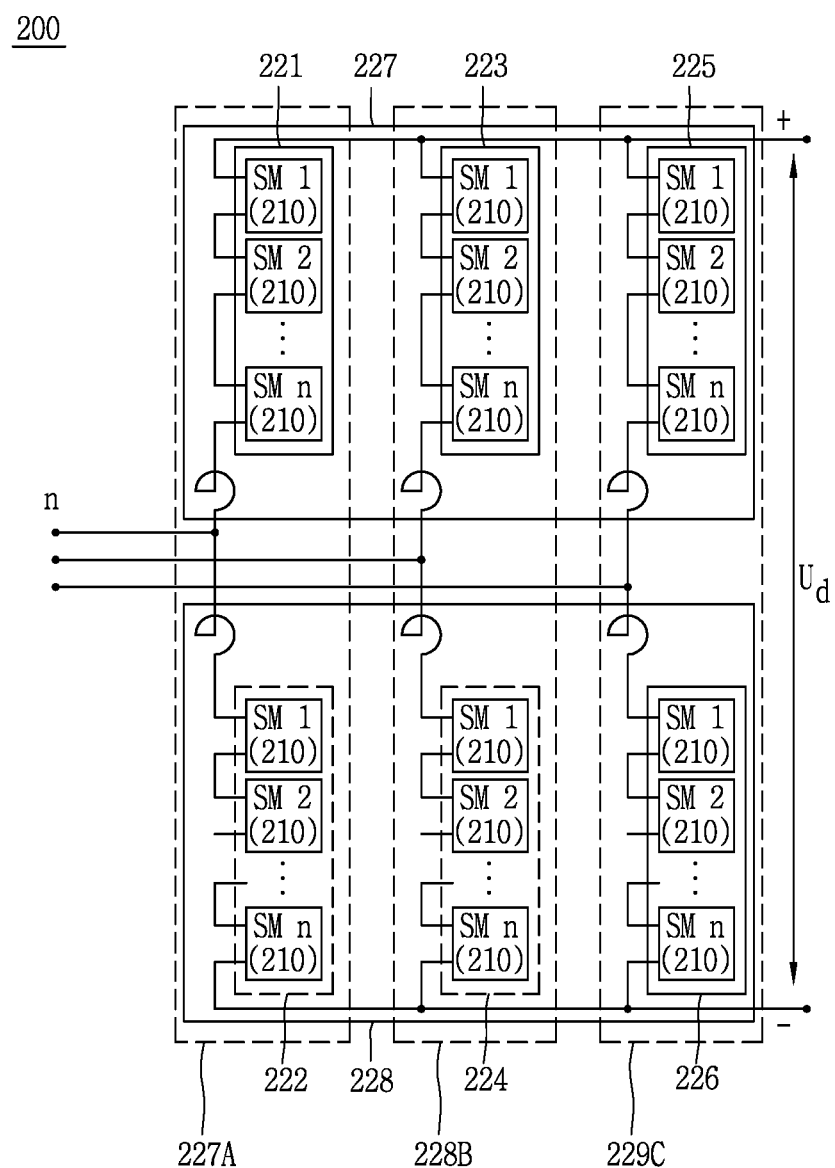
FIG. 7 illustrates connection of a plurality of sub-modules according to one embodiment of the present invention.

FIG. 7 illustrates connection of the plurality of sub-modules 210 included in a 3-phases modular multi-level converter 200.

Referring to FIG. 7, the plurality of sub-modules 210 can be connected in series, and the plurality of sub-modules 210 connected to the positive pole or the negative pole of one phase can form one arm.

In general, the 3-phases modular multi-level converter 200 includes 6 arms, since each of three phases, A, B, and C includes the positive pole and the negative pole.

Therefore, the 3-phases modular multi-level converter 200 includes a first arm 221 configured with a plurality of sub-modules 210 for the positive pole of A-phase, a second arm 222 configured with a plurality of sub-modules 210 for the negative pole of A-phase, a third arm 223 configured with a plurality of sub-modules 210 for the positive pole of B-phase, a fourth arm 224 configured with a plurality of sub-modules 210 for the negative pole of B-phase, a fifth arm 225 configured with a plurality of sub-modules 210 for the positive pole of C-phase, and a sixth arm 226 configured with a plurality of sub-modules 210 for the negative pole of C-phase.

And, a plurality of sub-modules 210 for one phase may form a leg.

Therefore, the 3-phases modular multi-level converter 200 may include a A-phase leg 227A including a plurality of sub-modules 210 for the A-phase, a B-phase leg 228B including a plurality of sub-modules 210 for the B-phase, and a C-phase leg 229C including a plurality of sub-modules 210 for the C-phase.

Therefore, the first arm 221 to the sixth arm 226 are included in the A-phase leg 227A, the B-phase leg 228B, and the C-phase leg 229C, respectively.

In more detail, the first arm 221 which is a positive pole arm of A-phase and the second arm 222 which is the negative pole arm of A-phase are included in the A-phase leg 227A, and the third arm 223 which is the positive pole arm of B-phase and the fourth arm 224 which is the negative pole arm of B-phase are included in the B-phase leg 228B. Also, the fifth arm 225 which is the positive pole arm of C-phase and the sixth arm 226 which is the negative pole arm of C-phase are included in the C-phase leg 229C.

Also, the plurality of sub-modules 210 may include the positive pole arm 227 and the negative pole arm 228 depending on polarity.

In more detail, referring to FIG. 7, the plurality of sub-modules 210 included in the modular multi-level converter 200 may be divided into a plurality of sub-modules 210 corresponding to the positive pole and a plurality of sub-modules 210 corresponding to the negative pole based on a neutral line (n).

Therefore, the modular multi-level converter 200 may include the positive pole arm 227 including a plurality of sub-modules 210 corresponding to the positive pole and the negative pole arm 228 including a plurality of sub-modules 210 corresponding to the negative pole.

Therefore, the positive pole arm may include the first arm 221, the third arm 223, and the fifth arm 225, and the negative pole arm may include the second arm 222, the fourth arm 224, and the sixth arm 226.

Next, a configuration of the sub-module 210 will be described with reference to FIG. 8.

Figure 8:
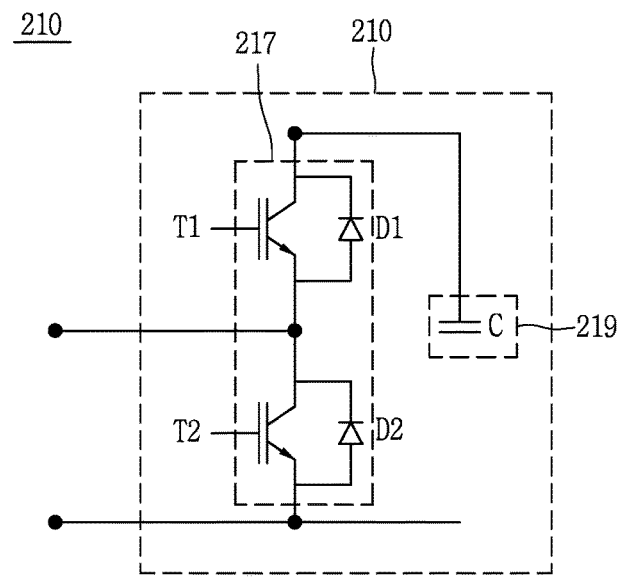
FIG. 8 is an exemplary view illustrating a configuration of sub-modules according to one embodiment of the present invention.

FIG. 8 is an exemplary view illustrating the configuration of the sub-module 210.

Referring to FIG. 8, the sub-module 210 includes two switches and two diodes, and a capacitor. This type of sub-module is also referred to as a half-bridge type or half bridge inverter.

In this case, a switch included in a switching part 217 may include a electric power semiconductor, so called power semiconductor. The power semiconductor is a semiconductor element for an electric power device and can be optimized for conversion or control of the electric power. And, the power semiconductor is also referred to as a valve or thyristor valve.

Since the switch included in the switching part 217 may include the power semiconductor, it may include an Insulated Gate Bipolar Transistor (abbreviated as IGBT), a Gate Turn-off Thyristor (abbreviated as GTO), an Integrated Gate Commutated Thyristor (abbreviated as IGCT), etc.

A storage part 219 includes a capacitor and thus can charge or discharge electric energy. Meanwhile, the sub-module may be represented as an equivalent model on the basis of the configuration and operation of the sub-module 210.

Figure 9:
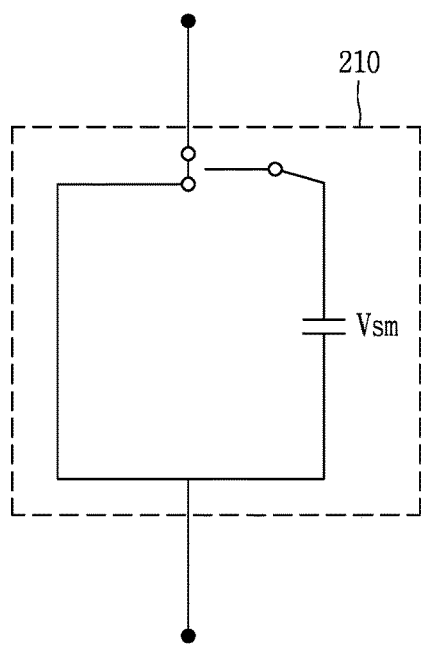
FIG. 9 illustrates an equivalent model of sub-module according to one embodiment of the present invention.

FIG. 9 illustrates an equivalent model of the sub-module 210. Referring to FIG. 9, the sub-module 210 may be represented as an energy charging and discharging device that includes a switch and a capacitor.

Therefore, it is noted that the sub-module 210 is the same as an energy charging and discharging device of which output voltage is Vsm.

Next, the operation of the sub-module 210 will be described with reference to FIGS. 10 to 13.

The switching part 217 of the sub-module 210 in FIGS. 10 to 13 includes a plurality of switches T1 and T2, each of which is connected diodes D1 and D2, respectively. The storage part 219 of the sub-module 210 includes a capacitor C.

The charging and discharging operation of the sub-module 210 will be described with reference to FIGS. 10 and 11.

Figure 10:
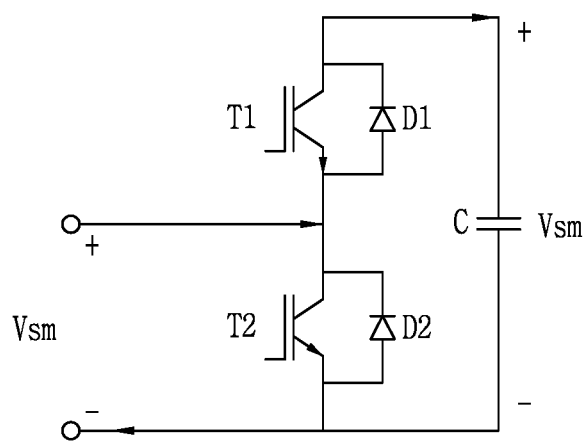
FIGS. 10 to 13 illustrate an operation of sub-modules according to one embodiment of the present invention.
Figure 11:
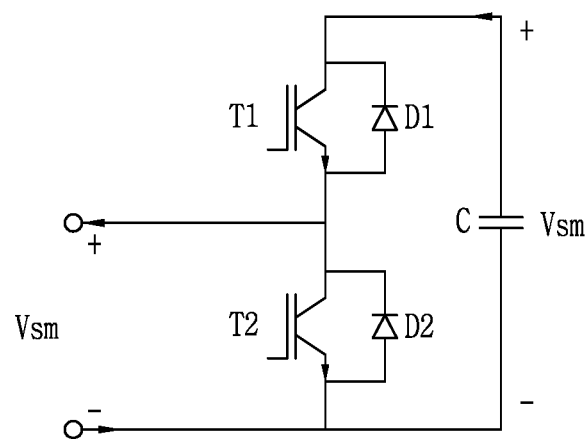

FIGS. 10 and 11 illustrates formation of a capacitor voltage Vsm of the sub-module 210.

Referring to FIGS. 10 and 11, the switch T1 of the switching part 217 represents a turn-on state and the switch T2 represents a turn-off state. Therefore, the sub-module 210 may form the capacitor voltage in accordance with the operation of each switch.

In more detail, referring to FIG. 10, a current flowing into the sub-module 210 passes through the switch T1, is transferred to the capacitor C, and forms the capacitor voltage Vsm. And the formed capacitor voltage Vsm can charge electric energy in the capacitor C.

And, the sub-module 210 can perform a discharging operation for discharging the charged energy.

In more detail, referring to FIG. 11, storage energy of the capacitor C, which is charged in the sub-module 210 is output through the switch T1. Therefore, the sub-module 210 may discharge the stored electric energy.

A bypass operation of the sub-module 210 will be described with reference to FIGS. 12 and 13.

Figure 12:
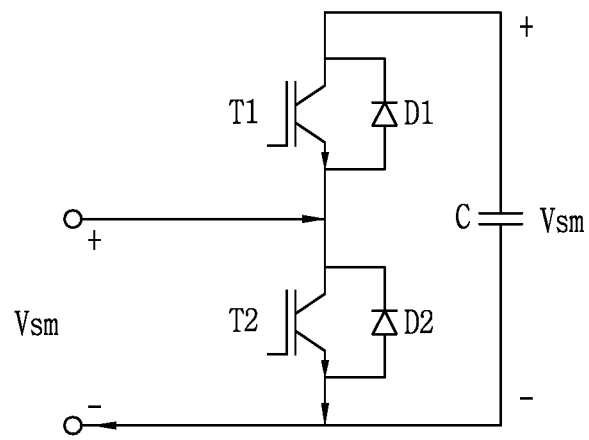
Figure 13:
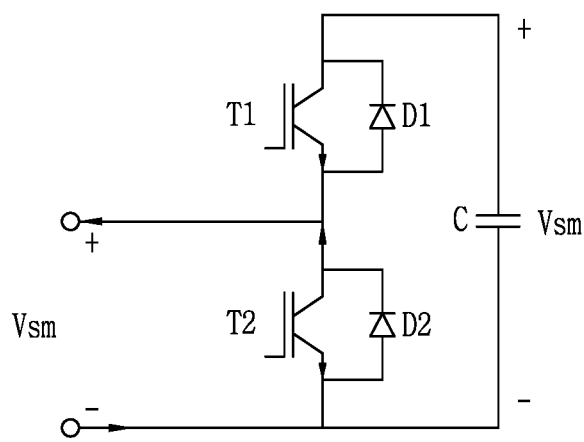

FIGS. 12 and 13 illustrate a formation of a zero voltage of the sub-module 210.

Referring to FIGS. 12 and 13, the switch T1 of the switching part 217 represents a turn-off state and the switch T2 represents a turn-on state. Since a current does not flow in the capacitor C of the sub-module 210, the sub-module 210 can form a zero voltage.

In more detail, referring to FIG. 12, the current flowing into the sub-module 210 is output through the switch T2, whereby the sub-module 210 can form a zero voltage.

And, referring to FIG. 13, the current flowing into the sub-module 210 is output through the diode D2, whereby the sub-module 210 can form a zero voltage.

As describe above, since the sub-module 210 can form a zero voltage, it can perform the bypass operation that just passes through the current without flowing into the sub-module 210.

Figure 14:
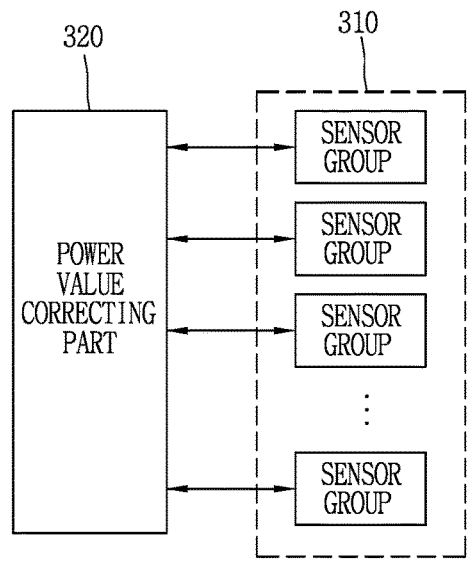
FIG. 14 is a block diagram illustrating a configuration of an electric power value correcting device according to one embodiment of the present invention.

FIG. 14 is a schematic block diagram illustrating an electric power value correcting device according to one embodiment of the present invention.

Referring to FIG. 14, the electric power value correcting device in the HDVC system according to the embodiment of the present invention comprises a plurality of sensor group 310 and an electric power value correcting part 320.

Each of sensor group 310 includes a current sensor for measuring current and a voltage sensor for measuring voltage and can be installed in each measuring position in the HDVC system.

For example, the plurality of sensor group 310 include a first sensor group, a second sensor group, and a third sensor group, wherein the first sensor group can be installed in the electric power receiving side transformer part or the electric power transmission side transformer part, the second sensor group can be installed in the electric power receiving side converter part or the electric power transmission side converter part, and the third sensor group can be installed in the DC electric power transmission part.

The electric power value correcting part 320 calculates an electric power value using current value and voltage value measured through the plurality of sensor group 310, respectively.

In this case, the electric power value correcting part 320 calculates the electric power value using current and voltage measured through each sensor group 310 and the line impedance of each of the sensor group.

The line impedance may mean impedance of the line connecting the current sensor with the voltage sensor, which are included in each sensor group 310.

The line impedance is set at the time of a system design and the electric power value correcting part 320 calculates the electric power value using the line impedance set at the time of the system design.

Also, on the other hand, the electric power value correcting part 320 may measure and calculate a line impedance value at the present time and calculate the electric power value using the measured and calculated line impedance.

The electric power value can be calculated using the following method.

$$P\_1 = V\_1 \times I\_1 \times t \qquad \text{[Equation 1]}$$

where P_1 is an electric power value, V_1 is a voltage value measured through the voltage sensor of the sensor group, I_1 is a current value measured through the current sensor of the sensor group, and t is a time of electric power transmission or electric power receiving.

That is, according to the Equation 1, the electric power value of the electric power conversion station included in the HVDC system is calculated as a product of time-dependent voltage and current values.

In this case, the HVDC system includes the electric power transmission conversion station, the electric power receiving conversion station, and the electric power transmission line connecting the conversion stations.

In this case, if the sensor group described above is the sensor group installed in the electric power transmission conversion station, the electric power value correcting part 320 calculates an electric power value delivered from the electric power transmission conversion station to the electric power receiving conversion station.

Also, if the sensor group is the sensor group installed in the electric power receiving conversion station, the electric power value correcting part 320 calculates an electric power value received by the electric power receiving conversion station.

In this case, depending on a condition, the electric power transmission conversion station may be operated as a electric power conversion station receiving an electric power transmitted from the electric power receiving conversion station, and the electric power receiving conversion station may be operated as a electric power conversion station delivering an electric power to the electric power transmission conversion station.

And, the line impedance is varied depending on whether the corresponding electric power conversion station is operated as the electric power receiving conversion station or the electric power transmission conversion station.

Accordingly, the electric power value correcting part 320 identifies the predetermined line impedance depending on an operating condition of the electric power conversion station (the condition of electric power transmission and the condition of electric power receiving) and calculates the electric power value using the corresponding impedance.

Meanwhile, according to the conventional art, a C&P (Control & Protection system) has been used to calculate an electric power value based on the Equation 1 only.

However, the voltage sensor measuring the voltage will have a margin of measuring errors, and the current sensor measuring the current will also have a margin of measuring errors. Accordingly, there may be a difference in the calculated electric power values due to the measuring errors of the voltage sensor and the current sensor, which measure the voltage and the current, respectively, and the difference is recognized as an electric power loss in the system.

For example, in the case where an error of the voltage sensor is ±0.5% and an error of the current sensor is ±0.5%, accordingly a measured voltage error is +0.5% and a measured current error is −0.5%, the electric power value can be calculated as follows.

$$P\_2 = V\_2 \times 0.005 \times I\_2 \times (-0.005) \times t = -V\_2 \times I\_2 \times 0.000025 \times t$$

In this case, since the electric power operated in the HVDC system has very big value, the measured error becomes very large as well.

Therefore, in the embodiment of the present invention, the electric power value is calculated using other equations in addition to the Equation 1, accordingly it is identified which error is bigger between the current measuring error and the voltage measuring error.

That is, the current can be expressed as the value that divided voltage by resistance in the Equation 1 and the voltage can be expressed as the product of current and resistance.

In this case, since the resistance means the line impedance, in the embodiment of the present invention, the electric power value can be calculated using either one of the measured current value and the measured voltage value, without using both of them.

$$P\_2 = I\_1 \times I\_1 \times Z\_1 \times t, \quad \text{[Equation 2]}$$

where P_2 is an electric power value, I_1 is a current value measured by the current sensor of the sensor group, Z_1 is a line impedance occurred in the corresponding operation condition and t is a time of electric power transmission or electric power receiving.

That is, the electric power value correcting part 320 can calculate the electric power value using the Equation 2, differently from the Equation 1.

Regarding the calculated electric power value according to the Equation 2, the voltage value measured through the voltage sensor of the sensor group has not been used but only the current value measured through the current sensor and the line impedance have been used.

$$P\_3 = V\_1 \times V\_1 / Z\_1 \times t, \quad \text{[Equation 3]}$$

where P_3 is an electric power value, V_1 is a voltage value measured through the voltage sensor of the sensor group, Z_1 is a line impedance occurred in the corresponding operation condition and t is a time of electric power transmission or electric power receiving.

Also, the electric power value correcting part 320 can calculate the electric power value using the Equation 3, differently from the Equations 1 and 2.

Regarding the calculated electric power value according to the Equation 3, the current value measured through the current sensor of the sensor group has not been but only the voltage value measured through the voltage sensor and the line impedance have been used.

Provided that the calculated electric power value according to the Equation 1 is a first electric power value, the calculated electric power value according to the Equation 2 is a second electric power value, and the calculated electric power value according to the Equation 3 is a third electric power value, the first to the third electric power values will be different from one another.

This is because that the measuring error of the current value measured through the current sensor of the sensor group is different from the measuring error of the voltage value measured through the voltage sensor in the magnitude.

Accordingly, the two electric power values among the first to the third electric power values are not very different from each other in the magnitude, and the other electric power value except for the two electric power values is very different from the two electric power values.

In other words, in the case where the measuring error of the current value and the measuring error of the voltage value are present, respectively and the measuring error of the current value is greater than the measuring error of the voltage value, the second electric power value calculated mainly using the current value with the greater measuring error is represented to be very different from the first and the third electric power values.

On the other hand, in the case where the measuring error of the voltage value is greater than the measuring error of the current value, the third electric power value calculated mainly using the voltage value with the greater measuring error is represented to be very different from the first and the second electric power values.

Accordingly, if it is determined that the measuring error of the voltage value is greater than the measuring error of the current value, the electric power value correcting part 320 determines the resulting value of the Equation 2 calculating the electric power value mainly using not the voltage value but the current value, as the actual electric power value of the corresponding electric power conversion station.

Also, on the contrary, if it is determined that the measuring error of the current value is greater than the measuring error of the voltage value, the electric power value correcting part 320 determines the resulting value of the Equation 3 calculating the electric power value mainly using not the current value but the voltage value, as the actual electric power value of the corresponding electric power conversion station.

Also, the electric power value correcting part 320 identifies an error level for a specific one of the above measured values, and thus generates a signal requesting a change of the sensor that has measured the corresponding measured value or correction of the measured value.

Also, if the error level of the specific measured value is out of a reference range, the electric power value correcting part 320 disregards the corresponding measured value and calculates an electric power value using other measured values.

That is, in the embodiment of the present invention, since the voltage measuring error and the current measuring error are different, the calculation methods of the Equation 2 and Equation 3 can verify a cause of errors better in the change of operating voltage and current than the Equation 1 and, based on that, can consistently reduce electric power loss (loss that is due to measuring errors).

That is, if an electric power loss due to measuring errors is largely due to errors of the current, the actual electric power value can be corrected by the electric power value calculated based on the measured voltage value and if an electric power loss due to measuring errors is largely due to errors of the voltage, the actual electric power value can be corrected by the electric power value calculated based on the measured current value.

Also, in the embodiment of the present invention, since the above methods are commonly used in the electric power transmission conversion station and electric power receiving conversion station, a loss due to measuring errors can be corrected, whereby electric power loss in measurement can be minimized.

Also, as described above, trend in the measuring errors of the current value and the voltage value measured in the electric power transmission conversion station and the electric power receiving conversion station can be compared, whereby the electric power of one of the electric power transmission conversion station and the electric power receiving conversion station, which has a higher occurrence frequency of error, can be corrected.

Also, since the current sensor and the voltage sensor actually have margins of errors, electric power loss can be calculated while the measured value out of the margin of errors are corrected or disregarded.

Figure 15:
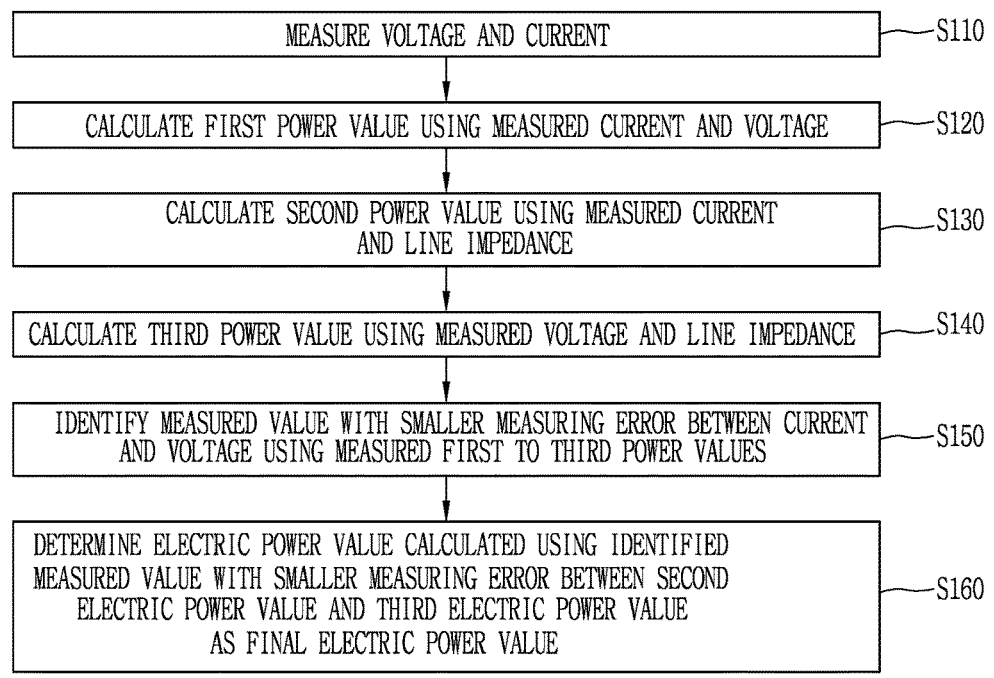
FIGS. 15 to 16 are flow charts illustrating steps of a method for measuring an electric power value in an HVDC system according to one embodiment of the present invention.
Figure 16:
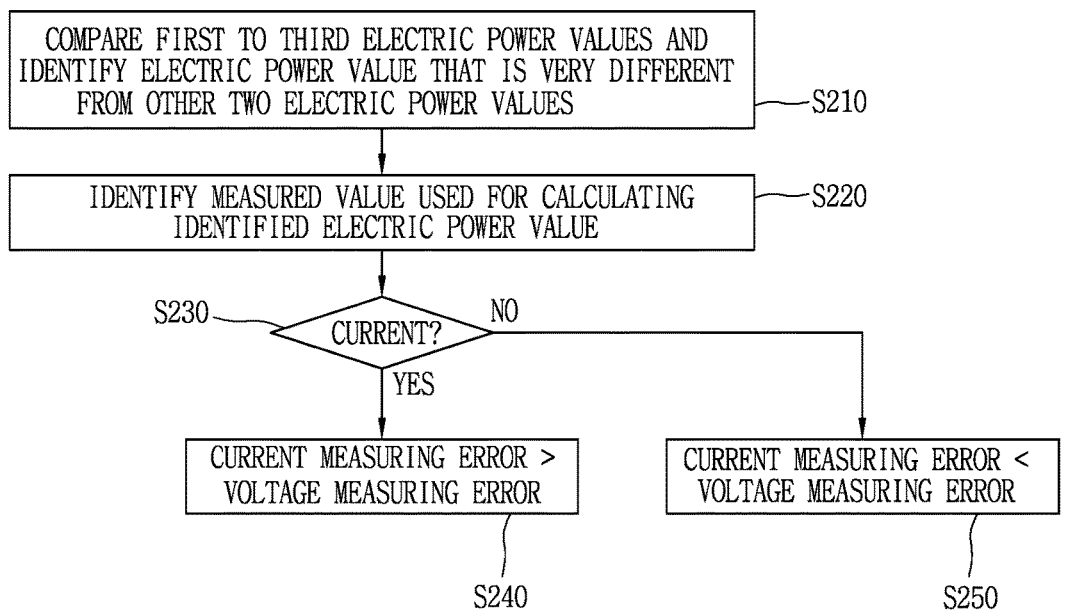

FIGS. 15 to 16 are flow charts illustrating steps of a method for measuring an electric power value in a HVDC system according to one embodiment of the present invention.

First of all, referring to FIG. 15, sensor group are installed in specific positions of the HDVC system and measure voltage values and current values in the corresponding position (Step 110).

Next, the electric power value correcting part 320 calculates the first electric power value by substituting the measured voltage value and the measured current value for the Equation 1 (Step 120)

Also, the electric power value correcting part 320 calculates the second electric power value by substituting the measured current value and the line impedance between the current sensor and the voltage sensor of the corresponding sensor group for the Equation 2 (Step 130).

In this case, since the line impedance has a different value depending on an operation mode, the electric power value correcting part 320 identifies the current operation mode and identifies the line impedance of the sensor group in accordance with the identified operation mode.

And, the electric power value correcting part 320 calculates the second electric power value based on the identified line impedance and the measured current value.

Also, the electric power value correcting part 320 calculates the third electric power value by substituting the measured voltage value and the line impedance for the Equation 3 (Step 140)

Next, the electric power value correcting part 320 compares the calculated first to the third electric power values with one another and identifies the measured value with the smaller measuring error between the measured current value and the measured voltage value (Step 150).

That is, a specific one of the first to the third electric power values is represented to be very different from the other two electric power values. This is because that the electric power value is calculated based on the specific measured value with the greater measuring error between the current value and the voltage value. That is, one of the second electric power value and the third electric power value is very different from the other two electric power values.

Accordingly, the electric power value correcting part 320 determines the electric power value calculated based on the measured value with the smaller measuring error between the second electric power value and the third electric power value as a final electric power value (Step 160).

That is, in the case where the second electric power value is very different from the first and the third electric power values, the electric power value correcting part 320 identifies that the measuring error of the current value is greater than the measuring error of the measured voltage value and therefore determines the third electric power value calculated based on the voltage value with the smaller measuring error as the final electric power value.

On the other hand, in the case where the third electric power value is very different from the first and the second electric power values, the electric power value correcting part 320 identifies that the measuring error of the voltage value is greater than the measuring error of the measured current value and therefore determines the second electric power value calculated based on the current value with the smaller measuring error as the final electric power value.

Hereinafter, process steps of identifying a level of the measuring error will be described in more detail.

Referring to FIG. 16, the electric power value correcting part 320 compares the first to the third electric power values calculated as above and identifies a specific electric power value that is very different from the other two electric power values (Step 210).

And, the electric power value correcting part 320 identifies a measured value used for calculating the identified specific electric power value (Step 220).

As a result of the identification, the electric power value correcting part 320 determines whether the measured value is the current value (Step 230).

And, if the measured value is the current value, the electric power value correcting part 320 determines that the measuring error of the measured current value is greater than the measuring error of the voltage value (Step 240).

Also, if the measured value is not the current value but the voltage value, the electric power value correcting part 320 determines that the measuring error of the measured voltage value is greater than the measuring error of the current value (Step 250).

According to the embodiment of the present invention, since electric power is calculated based on various approaches, changes in the measuring errors of the voltage and the current are compared, and accordingly electric power loss is calculated using a measured value with a small error, whereby electric power loss due to measuring errors of voltage and current in the HVDC system can be minimized.

Also, according to the embodiment of the present invention, since errors of electric power loss in the electric power conversion station due to measuring errors of the voltage and the current are corrected, efficiency of the HDVC system is improved, whereby the accuracy of electric power measuring and the reliability of operations can be improved.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A method for measuring an electric power value in a high voltage DC system having an electric power conversion station, the method comprising the steps of:

receiving a current value and a voltage value, which are measured from a sensor group installed in a position of the electric power conversion station, wherein the position comprises a location selected from the group consisting of an electric power receiving side transformer part, an electric power transmission side transformer part, an electric power receiving side converter part, an electric power transmission side converter part, and a DC electric power transmission part, and combinations thereof, wherein the sensor group comprises:
a current sensor that measures the current value; and
a voltage sensor that measures the voltage value;

identifying a line impedance of the position where the sensor group is installed;

calculating a first electric power value of the electric power conversion station by using the current value and the voltage value;

calculating a second electric power value of the electric power conversion station by using the current value and the line impedance;

calculating a third electric power value of the electric power conversion station by using the voltage value and the line impedance;

comparing the first electric power value, the second electric power value and the third electric power value with one another;

identifying a measured value with a smaller measuring error between a measuring error of the voltage value and a measuring error of the current value; and determining any one of the second and third electric power values as an actual electric power value of the electric power conversion station based on the comparing step, wherein the step of determining any one of the second and third electric power values as the actual electric power value comprises:

determining that the second electric power value calculated based on the current value and the line impedance is the actual electric power value of the electric power conversion station if it is identified that the measuring error of the voltage value is greater than the measuring error of the current value; and determining that the third electric power value calculated based on the voltage value and the line impedance is the actual electric power value of the electric power conversion station if it is identified that the measuring error of the current value is greater than the measuring error of the voltage value, wherein the step of identifying the measured value with the smaller measuring error comprises:

identifying that the measuring error of the current value is greater than the measuring error of the voltage value if the third electric power value is similar to the first electric power value, and the second electric power value is dissimilar to the first electric power value and the third electric power value; and identifying the measuring error of the voltage value is greater than the measuring error of the current value if the second electric power value is similar to the first electric power value, and the third electric power value is dissimilar to the first electric power value and the second electric power value.

2. The method according to claim 1, wherein the line impedance comprises an impedance of a line connecting the current sensor with the voltage sensor.

3. The method according to claim 1, further comprises a step of determining whether an operating condition of the electric power conversion station is an electric power transmission operating condition or an electric power receiving operating condition, wherein the step of identifying the line impedance of the position where the sensor group is installed comprises a step of identifying the line impedance corresponding to the operating condition.

4. The method according to claim 1, further comprising a step of outputting a signal requesting a change of a sensor that has measured a measured value with a greater measuring error.

* * * * *